United States Patent [19]

Ive et al.

[11] 4,415,994

[45] Nov. 15, 1983

[54] RANDOM ACCESS MEMORY ARRANGEMENTS

[75] Inventors: John G. S. Ive, London; Alan C. Thirlwall, Winchester, both of England

[73] Assignee: Sony Corporation, Tokyo, Japan

[21] Appl. No.: 302,107

[22] Filed: Sep. 14, 1981

[30] Foreign Application Priority Data

Sep. 19, 1980 [GB] United Kingdom ................. 8030300

[51] Int. Cl.³ ............................................ G11C 13/00
[52] U.S. Cl. ..................................... 365/189; 365/230
[58] Field of Search ........................ 365/174, 189, 230

[56] References Cited

U.S. PATENT DOCUMENTS 3,402,398  9/1968  Koerner et al. ...................... 365/189
3,560,940  2/1971  Gaensslew .......................... 365/189

Primary Examiner—Terrell W. Fears
Attorney, Agent, or Firm—Lewis H. Eslinger; Alvin Sinderbrand

[57] ABSTRACT

A random access memory arrangement for reading data out of and into a random access memory asynchronously, for example, to effect time base correction of a digital television signal, comprises a random access memory having common read and write data terminals, an input circuit for supplying input data to said read and write data terminals for writing in the random access memory, a first output latch circuit connected to the read and write data terminals, a second output latch circuit connected to the first latch circuit, and means for supplying control signals to enable the random access memory to write the input data therein at given addresses in synchronism with write pulses of a write pulse signal, to enable the random access memory to read output data from given addresses therein in synchronism with read pulses of a read pulse signal, the read pulse signal being asynchronous with the write pulse signal, to control the first output latch circuit to hold and to supply to the second output latch circuit data supplied to the first latch circuit immediately prior to each write pulse, and to pass therethrough to the second latch circuit data supplied to the first latch circuit at all other times, and to control the second latch circuit to hold the data supplied to it by the first latch circuit immediately prior to the beginning of each read pulse until the beginning of the next succeeding read pulse and to supply the data so held to an output of the arrangement.

7 Claims, 14 Drawing Figures

RANDOM ACCESS MEMORY ARRANGEMENTS

BACKGROUND OF THE INVENTION

1. Field of the Invention

This invention relates to random access memory (RAM) arrangements. More particularly, the invention relates to such arrangements in which data are written into and read out of a RAM asynchronously.

2. Description of the Prior Art

Where data are being written into and read out of a RAM synchronously the RAM can be supplied with a signal representing the data to be written in, a signal comprising a sequence of write addresses, a signal comprising a sequence of read addresses, a write control signal and a read control signal. The read control signal is normally a clock pulse signal with a 50% duty ratio and the period of the data signal and of the read and write address signals is equal to the period of the clock pulse signal. The write control signal is similar, but of the opposite phase. In the first half of each period of the read control signal, therefore, data are read from the RAM under control of the read control signal and in dependence on the corresponding read address. In the second half of each period of the write control signal, data are written into the RAM under control of the write control signal and in dependence on the corresponding write address. Delay in accessing addresses and in recovery after read-out result in short unusable intervals at each transition between reading and writing, but there is a clear interval during each read-out period in which the data to be read out can be derived.

The situation becomes more difficult, however, when read out and write in are not in synchronism. This occurs, for example, in time base correction of a television signal read out from a video tape recorder (VTR) and containing timing instabilities. It also occurs in processing a television signal prior to recording the signal on a VTR, for example, where digital data derived at a frequency related to the colour sub-carrier frequency is converted to data at a frequency related to the line frequency. This may involve conversion from say 8.86 Megahertz to 8.00 Megahertz. In both these cases, and in other applications, asynchronous access to a RAM is necessary. The problem is compounded by the use of larger RAMs which, although inherently advantageous due to their ability to store large amounts of data, are somewhat inflexible.

SUMMARY OF THE INVENTION

One object of the present invention is to provide a random access memory arrangement with which data can be written into and read from a random access memory asynchronously.

Another object of the present invention is to provide a random access memory arrangement having two output latch circuits cooperating to enable valid data to be read out during intervals between writing.

Another object of the present invention is to provide a random access memory arrangement usable for time base correction of a video signal.

According to the present invention there is provided a random access memory arrangement comprising:

a random access memory having common read and write data terminals; means for supplying input data to said read and write data terminals for writing in said random access memory;

a first output latch circuit connected to said read and write data terminals; a second output latch circuit connected to said first output latch circuit; and means for supplying control signals:

to enable said random access memory to write said input data therein at given addresses in synchronism with write pulses of a write pulse signal;

to enable said random access memory to read output data from given addresses therein in synchronism with read pulses of a read pulse signal, said read pulse signal being asynchronous with said write pulse signal;

to control said first output latch circuit to hold and to supply to said second output latch circuit data supplied to said first output latch circuit immediately prior to each said write pulse, and to pass therethrough to said second output latch circuit data supplied to said first output latch circuit at all other times; and to control said second output latch circuit to hold the data supplied to said second output latch circuit by said first output latch circuit immediately prior to the beginning of each said read pulse until the beginning of the next succeeding said read pulse and to supply the data so held to an output of said arrangement.

The above, and other objects, features and advantages of this invention will be apparent from the following detailed description of illustrative embodiments which is to be read in connection with the accompanying drawings.

BRIEF DESCRIPTION OF THE DRAWINGS

FIG. 4, including A–K are waveforms used for explaining the operation of the RAM arrangement of FIG. 3.

DESCRIPTION OF THE PREFERRED EMBODIMENTS

Before describing the embodiment some further consideration will be given to previously proposed RAM arrangements for handling data asynchronously in a television signal time base corrector and in a record processor.

Figure 1:
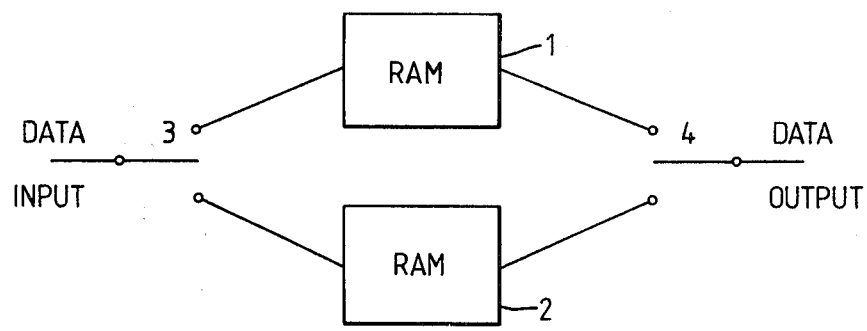
FIG. 1 is a simplified block diagram of a previously proposed RAM arrangement.
Figure 2:
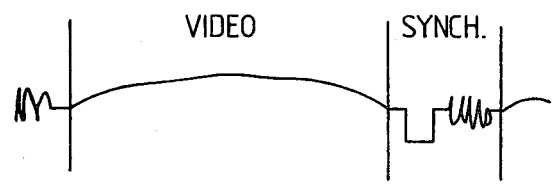
FIG. 2 indicates the waveform of one horizontal line of a television signal.

Consider, for example, digital data coming off the tape of a digital VTR, which data are to be stored in a RAM with some form of address control derived from the data itself. The data coming off the tape have timing instabilities, and time base correction is achieved by reading the data out of the RAM at a fixed rate locked to the required time base. One previously proposed arrangement is shown in FIG. 1 and comprises two RAMs 1 and 2 arranged so that while data are being written in the RAM 1, data are being read from the RAM 2 and vice versa. Basically, the necessary switching is achieved by exclusive switches 3 and 4. Despite the asynchronous operation, this arrangement is feasible. Firstly, this is because although the timing of the data received from the VTR is unstable, these instabilities average out over one cycle of the head drum of the VTR, because the head drum is locked to the field interval of the recorded television signal. In some cases, the VTR is line locked, in which case the instabilities average out over one horizontal line of the television signal. Secondly, the arrangement is feasible because not all of each horizontal line is recorded. As is seen in FIG. 2, each horizontal line of the television signal comprises the actual video information, which is recorded, and synchronizing information, which is not recorded but is reinserted subsequently. In the case of a line locked VTR therefore, the switches 3 and 4 can be changed over during the intervals occupied by the synchronizing information, and so long as the timing instabilities are short relative to the duration of the synchronizing information, which means not more than a few microseconds, switching will not occur during the writing or reading of the actual video information.

In one particular example of the arrangement of FIG. 1 the data to be stored comprise blocks of 512 active samples of a television signal, each sample being represented by an 8-bit word. RAMs capable of storing 256 4-bit words being readily available, this particular example uses four such RAMs for each of the RAMs 1 and 2, so eight RAMs provide the total required storage of 512 8-bit words. In the case of a line locked VTR with in excess of 1000 samples per line and therefore some 1000 8-bit words per line, a total of sixteen RAMs each capable of storing 256 4-bit words is required.

RAMs capable of storing 1024 4-bit words having now become available, it would be preferable to be able to use them, as only four such RAMs would be required to provide the same storage capacity as the sixteen 256 4-bit word RAMs used previously, with consequent saving of board space and wiring. For asynchronous operation, however, this does necessitate an arrangement in which each RAM can be written into and read from simultaneously, without the kind of switching between RAMs which occurs in the arrangement of FIG. 1.

Again, consider a record processor for a VTR which is to turn an input digital PAL television signal into a form suitable for recording. The data comprise samples at a frequency equal to twice the colour sub-carrier frequency, that is 8.86 MHz. This frequency is inconvenient for recording because it is not related to the line frequency. A more convenient frequency for recording is 8 MHz because it is exactly 512 times the line frequency. This provides 512 samples per line as against 567 at 8.86 MHz, but as samples relating to synchronizing information are dropped, the actual number of samples to be recorded is 512 or less. As before, therefore, when the record processor stores the data in a RAM the problem arises of asynchronous write in and read out, and again it would be convenient to be able to access the same RAM at the two asynchronous rates.

Figure 3:
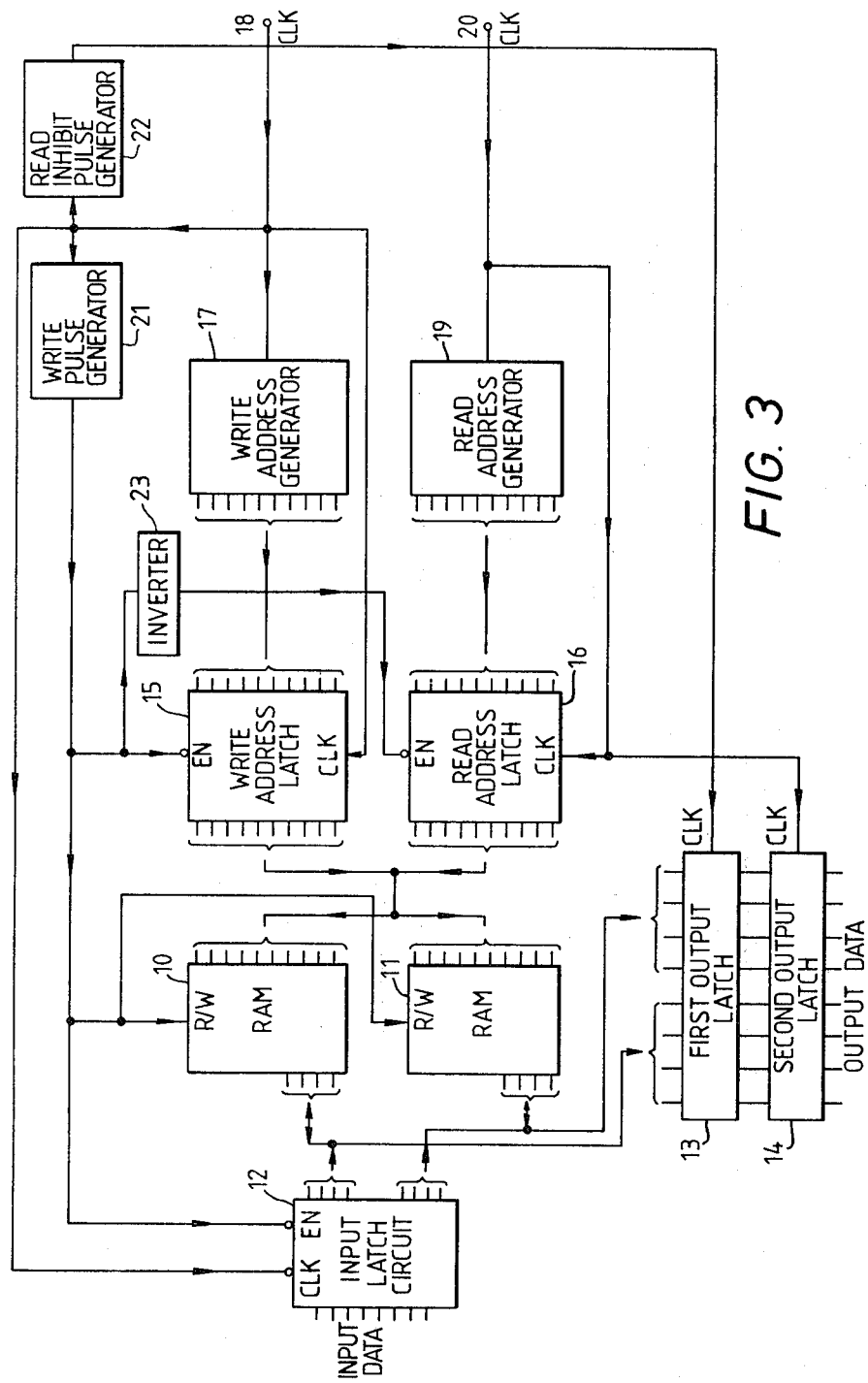
FIG. 3 is a block diagram of an embodiment of RAM arrangement according to the invention.

The embodiment of the invention will now be described, referring firstly to FIG. 3. The embodiment will be described as forming part of a time base corrector, but it will readily be seen that the invention can be used in other applications, such as in a record processor.

The arrangement comprises two RAMs 10 and 11 each of which is capable of storing 1024 4-bit words. Basically, therefore, the RAMs 10 and 11 provide the same total storage capacity as eight of the RAMs referred to in connection with the arrangement of FIG. 1, and when write in and read out are occurring simultaneously can provide storage of 512 samples each represented by an 8-bit word, the 1024 samples together representing the video information of two horizontal lines of a television signal. The storage capacity of the RAMs 10 and 11 is such that limitation in the number of pins available on the circuit chip dictates that write in and read out are effected using the same pins or ports, which will hereinafter be referred to as input/output data terminals.

Each of the RAMs 10 and 11 also has ten address terminals and a read/write control terminal. An input digital data signal comprising 8-bit words is supplied to the eight data terminals of an input latch circuit 12. The input latch circuit 12 has eight data output terminals, of which four are connected to the four input/output data terminals of the RAM 10 and four are connected to the four input/output data terminals of the RAM 11. The eight input/output terminals of the RAMs 10 and 11 are similarly connected to the eight data input terminals of a first output latch circuit 13 having eight data output terminals which are respectively connected to the eight data input terminals of a second output latch circuit 14, which has eight data output terminals from which the output data read out from the RAMs 10 and 11 is derived.

Each of the RAMs 10 and 11 has ten read/write address terminals, these terminals being common for both read and write addresses. Both the ten read/write address terminals of the RAM 10 and the ten read/write address terminals of the RAM 11 are respectively connected to the ten address output terminals of a write address latch circuit 5 and to the ten address output terminals of a read address latch circuit 16. Each of the address latch circuits 15 and 16 has ten address input terminals.

A write address signal generator 17 has ten output terminals respectively connected to the ten address input terminals of the write address latch circuit 15, and a clock terminal to which a write pulse signal having a frequency of 8.867 Megahertz is supplied from a terminal 18. A read address signal generator 19 has ten output terminals respectively connected to the ten address input terminals of the read address latch circuit 16, and a clock terminal to which a read pulse signal having a frequency of 8 Megahertz is supplied from a terminal 20.

The 8.867 Megahertz write pulse signal is also supplied from the terminal 18 to a clock terminal of the input latch circuit 12, to a clock terminal of the write address latch circuit 15, and to a write pulse generator 21 and a read inhibit pulse generator 22. The write pulses from the write pulse generator 21 are supplied to enable terminals of the input latch circuit 12 and of the write address latch circuit 15, to the read/write control terminal of the RAMs 10 and 11, and by way of an inverter 23 to an enable terminal of the read address latch circuit 16. The read inhibit pulses from the read inhibit pulse generator are supplied to a clock terminal of the first output latch circuit 13.

The 8 Megahertz read pulse signal is also supplied from the terminal 20 to a clock terminal of the read address latch circuit 16 and to a clock terminal of the second output latch circuit 14.

The output latch circuits 13 and 14 differ in operation. The first output latch circuit 13 is a so-called transparent latch. For one level of control signal applied thereto, say level "1", the first output latch circuit 13 is transparent, that is to say data supplied to the data input terminals is at once passed to the data output terminals. For another level of control signal applied thereto, however, say level "0", the first output latch circuit 13 holds the data that was being supplied to the data input terminals immediately prior to the transition from "1" to "0" of the control signal. So long as the control signal remains "0", therefore, the held data is supplied to the data output terminal of the first output latch circuit 13.

The second input latch circuit 14 is a so-called edge-triggered latch circuit which holds the data that was being supplied to the data input terminals thereof immediately prior to a positive edge, that is a transition from "0" to "1" of the control signal. Until the next such transition therefore, the held data is supplied to the data output terminals of the second output latch circuit 14.

Figure 4:
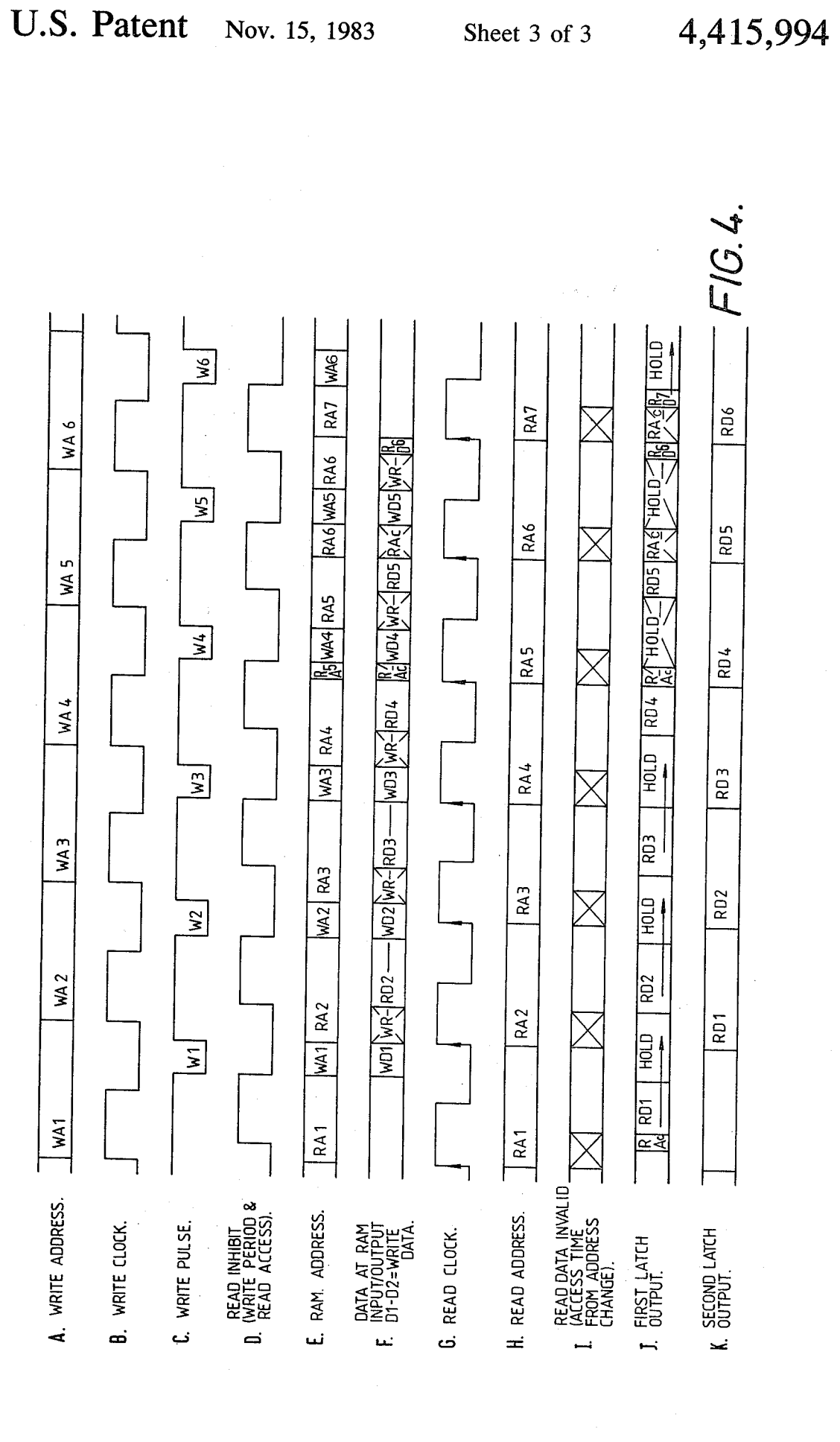

The operation of the embodiment of FIG. 3 will now be described with reference also to FIG. 4. The abbreviations used in FIG. 4 will first be explained:

WR = write recovery
WA = write address
WD = write data
RA = read address
RD = read data
RAc = read access The crosses in FIGS. 4F, 4I and FJ represent intervals when the data are invalid.

The word "hold" in FIG. 4J means the retention of current data in the first output latch circuit 13 due to read inhibit pulses.

With the combined read-write control there is the problem that there is no synchronism between the writing and reading addresses, which are moving relative to each other in time with no particular phase relationship.

FIG. 4A represents the signal on one output wire only of the write address latch circuit 15, this being representative of all the ten wires. Each wire is changing state between "1" and "0" in dependence on the successive addresses which change in synchronism with the 8.8567 Megahertz write pulse signal at the terminal 18 and represented in FIG. 4B. FIG. 4A represents a sequence of write addresses WA1, WA2, WA3, ... and FIG. 4C represents a sequence of write pulses W1, W2, W3, ... derived by the write pulse generator 21 from the write pulse signal of FIG. 4B.

FIG. 4D represents the read inhibit pulses derived by the read inhibit pulse generator 22 from the write pulse signal of FIG. 4B. Each read inhibit pulse starts in synchronism with a write pulse but continues beyond the end of the write pulse so as to include the necessary read access time required by a RAM.

FIG. 4H shows a sequence of read addresses RA1, RA2, RA3, ... and in the particular case of a time base corrector they have timing instabilities relative to the write address WA1, WA2, WA3, ... of FIG. 4A, although at some predetermined interval such as a horizontal line interval or a field interval, these timing instabilities average out. As shown, however, the phase of the read addresses RA1, RA2, RA3, ... does not coincide with the phase of the write addresses WA1, WA2, WA3, ..., and indeed the relative phasing can change continuously. The difficulty is, therefore, to identify intervals during which data appearing as the input/output terminals of the RAMs 10 and 11 and continuously supplied to the data input terminals of the first output latch circuit are valid data which it is desired to read out.

FIG. 4E shows the moving relationship between the read address RA1, RA2, RA3, ... of FIG. 4H and the write pulses W1, W2, W3, ... of FIG. 4C, the latter defining intervals in which the successive write addresses WA1, WA2, WA3, ... are accessed. As shown in FIG. 4F, therefore, in the intervals WD1, WD2, WD3, ... the data from the input latch circuit 12 are written into the respective addresses WA1, WA2, WA3, ... in the RAMs 10 and 11. Each interval WD1, WD2, WD3, ... is followed by a respective further interval WR which is the recovery time required by a RAM subsequent to writing before reading can be initiated. There remain, however, further intervals RD2, RD3, RD4, ... coincident with portions of successive read addresses RA2, RA3, RA4, ... (FIG. 4H) during which the data at the input/output terminals of the RAMs 10 and 11 is valid data that can be read out. However, there is another constraint on read-out, and this is that from each read address change there extends an interval, as shown in FIG. 4I in which the read data is invalid. Thus as seen in FIG. 4F the interval RD4 is restricted by part of a read access interval and the interval RD5 is restricted by most of a read access interval.

As previously described, the first output latch circuit 13 is a transparent latch, so when the read inhibit pulses are supplied to the clock terminal thereof, that is, the level of the waveform of FIG. 4D is "1", the data at the data input terminals thereof, which means the data at the input/output terminals of the RAMs 10 and 11 because the input latch circuit 12 is not then enabled, is supplied directly to the data output terminals, and when this level changes to 37 " the data last supplied is held. This is shown in FIG. 4J which shows the output of the first output latch circuit 13. It will be seen that the first output latch circuit 13 sometimes holds valid read data, for example, that read in interval RD2, although at other times the data held is not valid. However, the important point is that just prior to each positive edge of the read pulse signal, indicated by arrows in FIG. 4G, the first output latch circuit 13 is either passing directly or holding and passing valid read data to the input of the second output latch circuit 14. As the second output latch circuit 14 is an edge-triggered latch circuit, as previously described, it continuously derives and holds valid data, and supplies this data at the frequency determined by the read pulse signal (FIG. 4G) to the output of the RAM arrangement as indicated in FIG. 4K. Moreover, it can be shown that whatever the relative write/read frequencies this will be true, that is, valid data are always present on the input to the second output latch circuit 14 just prior to a positive edge of the read clock pulse signal.

Although the embodiment as described forms part of a time base corrector, it will be seen that the invention can be applied in other circumstances where asynchronous access to a RAM is required, for example in a record processor for a VTR which is to turn a input digital PAL television signal into a form suitable for recording, and generally as described above.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A random access memory arrangement comprising:

a random access memory having common read and write data terminals;

means for supplying input data to said read and write data terminals for writing in said random access memory;

a first output latch circuit connected to said read and write data terminals;

a second output latch circuit connected to said first output latch circuit and having an output;

means responsive to a write pulse signal having write pulses, for supplying control signals to said random access memory to enable said random access memory to write said input data therein at given addresses in synchronism with said write pulses of said write pulse signal;

means responsive to a read pulse signal having read pulses, for supplying control signals to said random access memory to enable said random access memory to read output data from given addresses therein in synchronism with said read pulses of said read pulse signal, said read pulse signal being asynchronous with said write pulse signal;

means responsive to said write pulse signal for supplying signals to control said first output latch circuit to hold and to supply to said second output latch circuit data supplied to said first output latch circuit immediately prior to each said write pulse, and to pass therethrough to said second output latch circuit data supplied to said first output latch circuit at all other times; and means for supplying said read pulse signal to said second output latch circuit for causing the latter to hold the data supplied to said second output latch circuit by said first output latch circuit immediately prior to the beginning of each said read pulse until the beginning of the next succeeding said read pulse and to supply the data so held to said output of said second output latch circuit.

2. An arrangement according to claim 1, wherein said means for supplying input data comprises an input latch circuit connected to said read and write data terminals of said random access memory, said input latch circuit receiving said write pulse signal for controlling the supplying of said input data to said read and write data terminals.

3. An arrangement according to claim 2, wherein said means responsive to said write pulse signal for supplying signals to control said first output latch circuit comprises means to derive a read inhibit pulse signal in synchronism with said write pulses of said write pulse signal, said read inhibit pulse signal being supplied to control said first output latch circuit.

4. An arrangement according to claim 1, wherein said means responsive to said write pulse signal for supplying control signals to said random access memory includes a write address generator and a write address latch circuit, for supplying write addresses to said random access memory from said write address generator by way of said write address latch circuit, said write address generator and said write address latch circuit being synchronously controlled by said write pulse signal.

5. An arrangement according to claim 4, wherein said means responsive to said read pulse signal for supplying control signals to said random access memory includes a read address generator and a read address latch circuit, for supplying read addresses to said random access memory from said read addresses generator by way of said read address latch circuit, said read address generator and said read address latch circuit being synchronously controlled by said read pulse signal.

6. An arrangement according to claim 1, wherein said first output latch circuit is a transparent latch circuit.

7. An arrangement according to claim 1, wherein said second output latch circuit is an edge-triggered latch circuit.

* * * * *